United States Patent
Nagahata

(10) Patent No.: US 11,007,780 B2
(45) Date of Patent: May 18, 2021

(54) DEVICE USING A PIEZOELECTRIC FILM

(71) Applicant: ROHM CO., LTD., Kyoto (JP)

(72) Inventor: Takaya Nagahata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 633 days.

(21) Appl. No.: 15/896,724

(22) Filed: Feb. 14, 2018

(65) Prior Publication Data

US 2018/0170053 A1    Jun. 21, 2018

Related U.S. Application Data

(63) Continuation of application No. 14/660,925, filed on Mar. 17, 2015, now Pat. No. 9,925,771.

(30) Foreign Application Priority Data

Mar. 18, 2014  (JP) .................... 2014-55158
Mar. 18, 2014  (JP) .................... 2014-55159
Mar. 18, 2014  (JP) .................... 2014-55160
Jan. 23, 2015  (JP) .................... 2015-11715

(51) Int. Cl.
| | |
|---|---|
| *H01L 41/047* | (2006.01) |
| *B41J 2/14* | (2006.01) |
| *H01L 41/09* | (2006.01) |
| *B41J 2/16* | (2006.01) |
| *H01L 41/08* | (2006.01) |
| *H01L 41/187* | (2006.01) |
| *H01L 41/318* | (2013.01) |

(52) U.S. Cl.
CPC ........... *B41J 2/14233* (2013.01); *B41J 2/161* (2013.01); *B41J 2/1628* (2013.01); *B41J 2/1629* (2013.01); *B41J 2/1631* (2013.01); *B41J 2/1632* (2013.01); *B41J 2/1645* (2013.01); *B41J 2/1646* (2013.01); *H01L 41/047* (2013.01); *H01L 41/0973* (2013.01); *B41J 2002/14258* (2013.01); *H01L 41/0815* (2013.01); *H01L 41/1876* (2013.01); *H01L 41/318* (2013.01)

(58) Field of Classification Search
CPC .................. H01L 41/047; H01L 41/0815; H01L 41/0973
See application file for complete search history.

(56) References Cited

U.S. PATENT DOCUMENTS

| | | |
|---|---|---|
| 2007/0186397 A1 | 8/2007 | Lim et al. |
| 2007/0236104 A1* | 10/2007 | Fujii ................... B41J 2/161 310/358 |
| 2011/0121689 A1* | 5/2011 | Grannen ............ H03H 9/02015 310/357 |

(Continued)

FOREIGN PATENT DOCUMENTS

| | | |
|---|---|---|
| JP | H06-40727 A | 2/1994 |
| JP | H09-286104 A | 11/1997 |

(Continued)

*Primary Examiner* — Derek J Rosenau
(74) *Attorney, Agent, or Firm* — Rabin & Berdo, P.C.

(57) ABSTRACT

A piezoelectric film includes a plurality of laminated main baking unit PZT layers. A first seed layer is present at a lower surface side of a lowermost main baking unit PZT layer. A second seed layer is interposed between two adjacent main baking unit PZT layers at an intermediate position between the lowermost main baking unit PZT layer and an uppermost main baking unit PZT layer.

11 Claims, 10 Drawing Sheets

(56) References Cited

U.S. PATENT DOCUMENTS

2013/0265370 A1    10/2013   Nagahata
2014/0267511 A1    9/2014   Yazaki et al.

FOREIGN PATENT DOCUMENTS

| JP | H11-078014 A | 3/1999 |
| --- | --- | --- |
| JP | H11-151815 A | 6/1999 |
| JP | H11192713 A | 7/1999 |
| JP | 2000-108347 A | 4/2000 |
| JP | 2000-318154 A | 11/2000 |
| JP | 2002367985 A | 12/2002 |
| JP | 2006-216685 A | 8/2006 |
| JP | 2006245247 A | 9/2006 |
| JP | 2013-215930 A | 10/2013 |
| JP | 2014172392 A | 9/2014 |

* cited by examiner

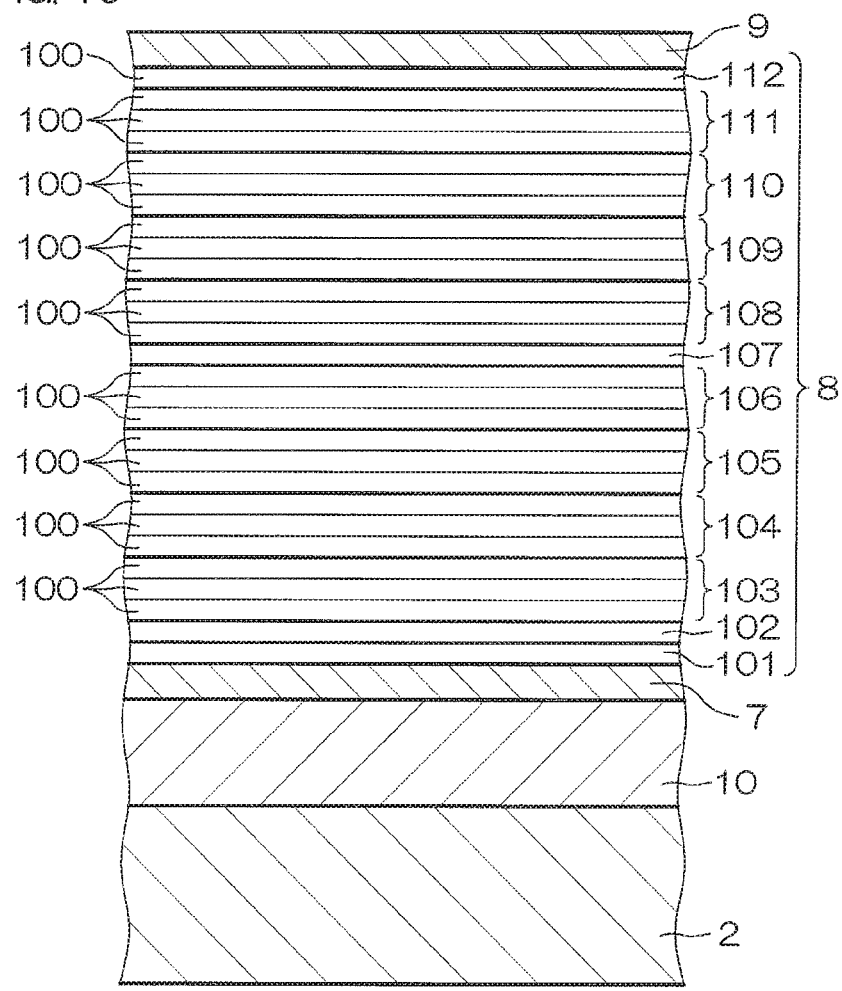

DEVICE USING A PIEZOELECTRIC FILM

CROSS-REFERENCE TO RELATED APPLICATIONS

This is a continuation application of U.S. application Ser. No. 14/660,925, filed on Mar. 17, 2015, and allowed on Nov. 16, 2017, which is based upon and claim the benefit of priority from Japanese Patent Application No. 2014-055160, filed on Mar. 18, 2014, Japanese Patent Application No. 2014-055159, filed on Mar. 18, 2014, Japanese Patent Application No. 2014-055158, filed on Mar. 18, 2014, and Japanese Patent Application No. 2015-011715, filed on Jan. 23, 2015. The entire disclosures of these prior U.S. and foreign applications are incorporated herein by reference.

BACKGROUND OF THE INVENTION

1. Field of the Invention

The present invention relates to a device using a piezoelectric film, such as an actuator or sensor, etc., that uses a piezoelectric film.

2. Description of the Related Art

An inkjet printing head is known as an actuator that uses a piezoelectric film. An example of such an inkjet printing head is disclosed in Japanese Patent Application Publication No. 2013-215930. The inkjet printing head disclosed in Japanese Patent Application Publication No. 2013-215930 includes a nozzle substrate, a pressure chamber substrate, a vibrating film, and a piezoelectric element bonded to the vibrating film. A pressure chamber, into which ink is introduced, is formed in the pressure chamber substrate and the vibrating film faces the pressure chamber. The piezoelectric element is arranged by laminating a lower electrode, a piezoelectric film, and an upper electrode in that order from the vibrating film side.

Lead zirconate titanate (PZT: $PbZr_xTi_{1-x}O_3$) is a perovskite ferroelectric substance, and sensors and actuators that make use of its excellent piezoelectric characteristics have been proposed. A piezoelectric film that uses PZT is formed by a sputtering method or a sol-gel method. The forming of a PZT film by a sol-gel method is described, for example, in Japanese Patent Application Publication No. 6-40727. The sol-gel method includes a coating process of coating on a precursor solution, containing PZT, to form a coating film, a drying process of drying the coating film, a prebaking process of heating the coating film after the drying process to make the coating film undergo gelling, and a main baking process of heat-treating and thereby sintering the gelled coating film. Ordinarily, the PZT film is formed by performing the main baking process after repeating a process, constituted of the coating process, the drying process and the prebaking process, a plurality of times. The piezoelectric film having a targeted film thickness is formed by such a series of processes being performed repeatedly. The piezoelectric film thus includes a plurality of laminated PZT layers.

SUMMARY OF THE INVENTION

The inventor of preferred embodiments of the present invention described and claimed in the present application conducted an extensive study and research regarding a device using a piezoelectric film, such as the one described above, and in doing so, discovered and first recognized new unique challenges and previously unrecognized possibilities for improvements as described in greater detail below.

With the arrangement described in Japanese Patent Application Publication No. 2013-215930, the lower electrode is formed to have a uniform thickness. Although to make the displacement of the vibrating film large, it is preferable for the lower electrode to be thinner in thickness, if the lower electrode is made thin in thickness, the lower electrode increases in resistance value.

An object of the present invention is to provide a device using a piezoelectric film with which a lower electrode can be made low in resistance value and a vibrating film can be made large in displacement.

In order to overcome the previously unrecognized and unsolved challenges described above, a device using a piezoelectric film according to the present invention includes a cavity, a vibrating film formation layer including a vibrating film disposed above the cavity and defining a top surface portion of the cavity, and a piezoelectric element formed to contact a surface of the vibrating film at an opposite side from the cavity and having a peripheral edge receded further toward an interior of the cavity than the vibrating film in a plan view of viewing from a direction normal to a major surface of the vibrating film, the piezoelectric element includes a lower electrode formed on a surface of the vibrating film formation layer at the opposite side from the cavity, an upper electrode disposed at an opposite side from the vibrating film formation layer with respect to the lower electrode, and a piezoelectric film provided between the upper electrode and the lower electrode, the lower electrode includes a main electrode portion constituting the piezoelectric element and an extension portion lead out from the main electrode portion in a direction along the surface of the vibrating film formation layer to cross over a top surface portion peripheral edge of the cavity and extend outside the cavity in the plan view, and, in the plan view, the main electrode portion is included in an inner electrode region of the lower electrode located further inward than the top surface portion peripheral edge of the cavity, the extension portion includes an outer electrode region of the lower electrode connected to the inner electrode region and located further outward than the top surface portion peripheral edge of the cavity, and the lower electrode has a thin portion formed thinly to cross over a boundary line between the inner electrode region and the outer electrode region.

A region of the vibrating film between a peripheral edge of the vibrating film and the peripheral edge of the piezoelectric element, that is, a peripheral edge portion of the vibrating film is a region that is not constrained by the piezoelectric element or a peripheral wall of the cavity and is a region in which a large deformation occurs. Therefore, when the piezoelectric element is driven, the peripheral edge portion of the vibrating film bends so that an inner peripheral edge side of the peripheral edge portion of the vibrating film is displaced in a thickness direction of the cavity and an entirety of a central portion surrounded by the peripheral edge portion of the vibrating film is thereby displaced in the thickness direction of the cavity.

Of a region of the lower electrode crossing over the boundary line of the inner electrode region and the outer electrode region in a plan view, a region located further inward than the top surface portion peripheral edge of the cavity is formed on the peripheral edge portion of the vibrating film. The region of the lower electrode crossing over the boundary line of the inner electrode region and the outer electrode region may thus obstruct the deformation of the vibrating film. In the present invention, the lower electrode has the thin portion that is formed thinly to cross over the boundary line between the inner electrode region and the outer electrode region. The deformation of the vibrating film is thereby made less likely to be obstructed in comparison to a case where the entire lower electrode is thick in thickness.

Also with the present invention, the thickness of a region of the lower electrode besides the thin portion can be formed to be thicker than the thin portion and the lower electrode can thus be decreased in resistance value compared to a case where the entire lower electrode is thin in thickness. A device using a piezoelectric film, with which the lower electrode can be made low in resistance value and the vibrating film can be made large in displacement, can thus be provided with the present invention.

In a preferred embodiment of the present invention, the thin portion is formed across an entirety of the boundary line between the inner electrode region and the outer electrode region of the lower electrode. With this arrangement, the displacement of the vibrating film can be increased in comparison to a case where the thin portion is formed only at a portion of the boundary line between the inner electrode region and the outer electrode region of the lower electrode.

In the preferred embodiment of the present invention, the main electrode portion is also formed at a thin portion of thin thickness. With this arrangement, the displacement of the vibrating film can be increased further.

In the preferred embodiment of the present invention, the thickness of a region of the lower electrode including the main electrode portion is thicker than the thickness of the thin portion. With this arrangement, the lower electrode can be decreased further in resistance value.

In the preferred embodiment of the present invention, the thickness of the entirety of the main electrode portion is thicker than the thickness of the thin portion and the thickness of a region of the inner electrode region besides the main electrode portion is thin. With this arrangement, the lower electrode can be decreased further in resistance value and the displacement of the vibrating film can be increased further.

In the preferred embodiment of the present invention, the thin portion is formed at a portion of the boundary line between the inner electrode region and the outer electrode region of the lower electrode. With this arrangement, the lower electrode can be decreased in resistance value in comparison to a case where the thin portion is formed across the entirety of the boundary line between the inner electrode region and the outer electrode region of the lower electrode.

In the preferred embodiment of the present invention, the thin portion includes a plurality of thin portions formed at intervals along the boundary line between the inner electrode region and the outer electrode region of the lower electrode.

In the preferred embodiment of the present invention, the plurality of the thin portions have rectangular shapes that are long in a direction along the boundary line between the inner electrode region and the outer electrode region of the lower electrode.

In the preferred embodiment of the present invention, the thickness of the region of the lower electrode including the main electrode portion is thicker than the thickness of the thin portion. With this arrangement, the lower electrode can be decreased further in resistance value.

In the preferred embodiment of the present invention, the thickness of the entirety of the main electrode portion is thicker than the thickness of the thin portion and the thickness of the region of the inner electrode region besides the main electrode portion is thin. With this arrangement, the lower electrode can be decreased further in resistance value and the displacement of the vibrating film can be increased further.

In the preferred embodiment of the present invention, in the plan view, the top surface portion of the cavity has a rectangular shape that is long in one direction, the main electrode portion has, in the plan view, a rectangular shape being long in the one direction and having a width shorter than a width in a short direction of the top surface portion of the cavity and a length shorter than a length in a long direction of the top surface portion of the cavity, with both end edges and both side edges thereof receded further toward the interior of the cavity than both end edges and both side edges of the top surface portion of the cavity, the extension portion extends from respective side edges of the main electrode portions to the outside of corresponding side edges of the top surface portion of the cavity upon crossing over intermediate portions of the top surface portion side edges, and the boundary line between the inner electrode region and the outer electrode region includes two boundary lines corresponding to the intermediate portions of the respective side edges of the top surface portion of the cavity.

In the preferred embodiment of the present invention, a plurality of the cavities are provided and the plurality of the cavities are disposed to be aligned in the short direction of each cavity. With this arrangement, a device using a piezoelectric film, which is suited for an inkjet printing head, can be provided.

In the preferred embodiment of the present invention, mutually facing side edges of two of the main electrode portions respectively disposed above two of the cavities that are mutually adjacent are connected to each other by the extension portion lead out therefrom and the thickness of substantially the entirety of a region of the extension portion between the two mutually adjacent cavities is thicker than the thickness of the thin portion. With this arrangement, a device using a piezoelectric film, which is suited for an inkjet printing head and with which the lower electrode is even lower in resistance value, can be provided.

In the preferred embodiment of the present invention, the extension portion lead out from a plurality of the main electrode portions disposed above a plurality of the cavities is, in the plan view, connected at a position further outside the respective cavities than one end in the long direction of the respective cavities. With this arrangement, the lower electrode can be connected to the exterior at the position further outside the respective cavity than the one end in the long direction of the respective cavities.

In the preferred embodiment of the present invention, a plurality of cutout portions are formed in regions of the lower electrode, which, in the plan view, respectively include end portions of the respective cavities at the one end side in the long direction. With this arrangement, the displacement of the piezoelectric film of each piezoelectric element can be increased further.

Other elements, features, steps, characteristics and advantages of the present invention will become more apparent from the following detailed description of the preferred embodiments with reference to the attached drawings.

BRIEF DESCRIPTION OF THE DRAWINGS

FIG. 10 is a schematic sectional view of a piezoelectric film.

DETAILED DESCRIPTION OF THE PREFERRED EMBODIMENTS

Figure 1:
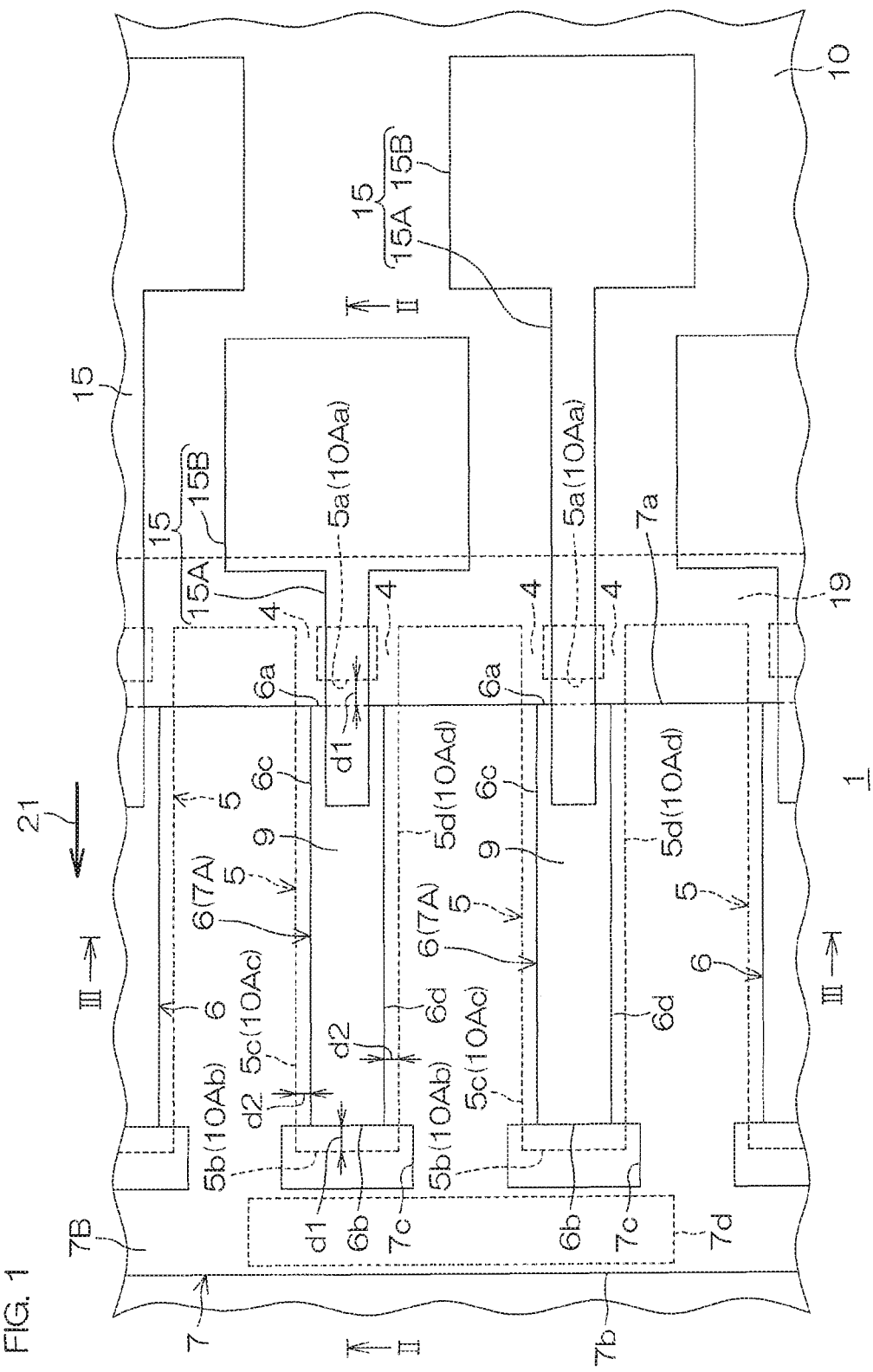
FIG. 1 is a schematic plan view of an inkjet printing head to which a device using a piezoelectric film according to a preferred embodiment of the present invention is applied.
Figure 2:
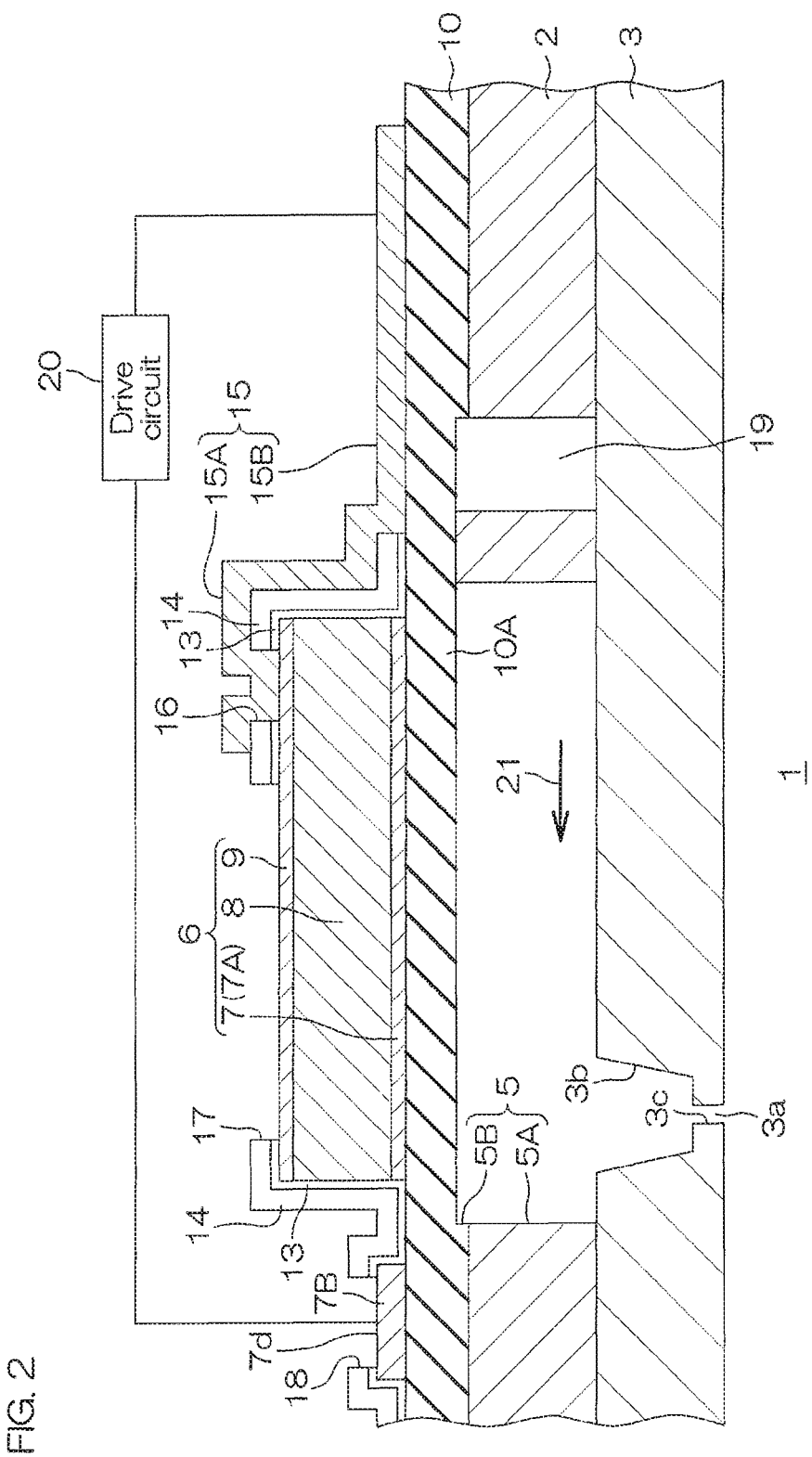
FIG. 2 is a schematic enlarged sectional view taken along line II-II in FIG. 1.
Figure 3:
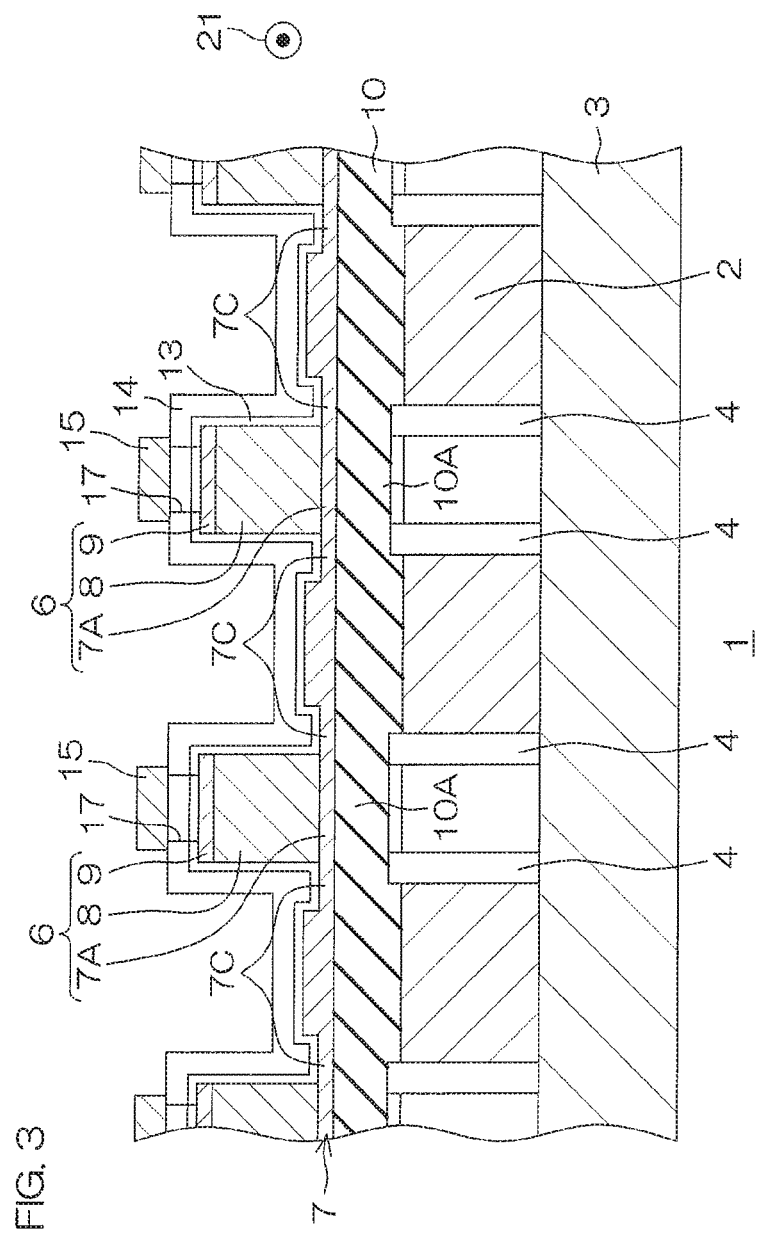
FIG. 3 is a schematic enlarged sectional view taken along line in FIG. 1.
Figure 4:
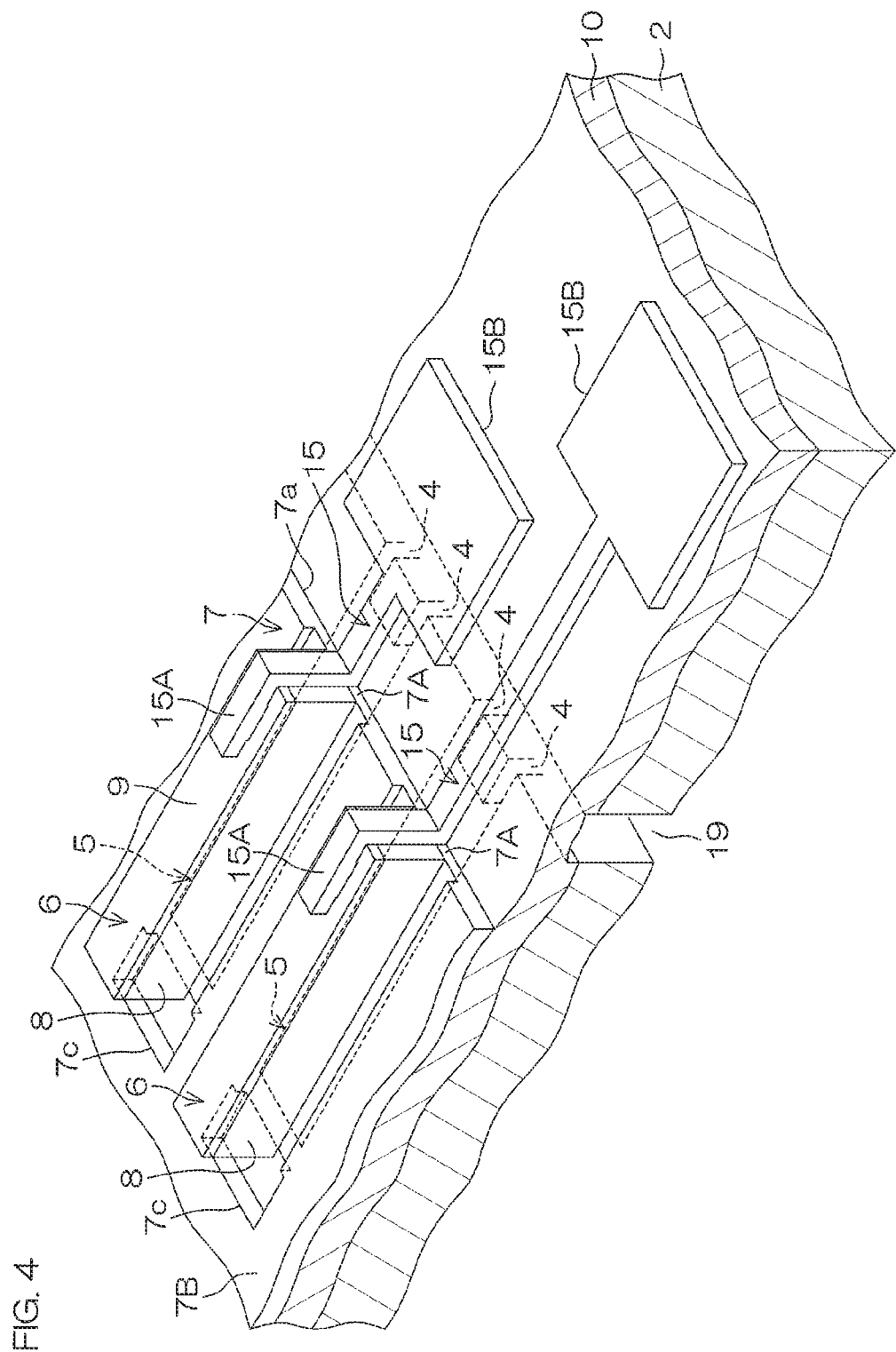
FIG. 4 is a schematic perspective view of the inkjet printing head.

FIG. 1 is a schematic plan view of an inkjet printing head to which a device using a piezoelectric element according to a preferred embodiment of the present invention is applied. FIG. 2 is a schematic enlarged sectional view taken along line II-II in FIG. 1. FIG. 3 is a schematic enlarged sectional view taken along line in FIG. 1. FIG. 4 is a schematic perspective view of the inkjet printing head. A hydrogen barrier film indicated by the symbol 13 and an insulating film indicated by the symbol 14 in FIG. 2 and FIG. 3 are omitted in FIG. 1 and FIG. 4.

Referring to FIG. 2, the inkjet printing head 1 includes a silicon substrate 2 and a nozzle substrate 3 having a discharge port 3a that discharges ink. A vibrating film formation layer 10 is laminated on the silicon substrate 2. In the laminate of the silicon substrate 2 and the vibrating film formation layer 10, a pressure chamber (cavity) 5 is formed as ink flow passages (ink reservoirs). The pressure chamber 5 is constituted of a space portion 5A, formed in the silicon substrate 2 and penetrating through the silicon substrate 2 in a thickness direction, and a recess 5B, formed in a rear surface (surface at the silicon substrate 2 side) of the vibrating film formation layer 10 and continuous to the space portion 5A.

The nozzle substrate 3 is constituted, for example, of a silicon plate, is adhered to a rear surface of the silicon substrate 2, and, together with the silicon substrate 2 and the vibrating film formation layer 10, defines the pressure chamber 5. The nozzle substrate 3 has a recess 3b facing the pressure chamber 5 and an ink discharge passage 3c is formed in a bottom surface of the recess 3b. The ink discharge passage 3c penetrates through the nozzle substrate 3 and has a discharge port 3a at an opposite side from the pressure chamber 5. Therefore, when a volume change occurs in the pressure chamber 5, the ink retained in the pressure chamber 5 passes through the ink discharge passage 3c and is discharged from the discharge port 3a.

The pressure chamber 5 is formed by digging into the silicon substrate 2 and the vibrating film formation layer 10 from the rear surface side of the silicon substrate 2. Ink supply passages 4 (see FIG. 1 and FIG. 3 together), in communication with the pressure chamber 5, are further formed in the silicon substrate 2 and the vibrating film formation layer 10. The ink supply passages 4 are in communication with the pressure chamber 5 and are formed to guide ink from an ink tank (for example, an ink cartridge) that is an ink supply source to the pressure chamber 5.

The pressure chamber 5 is formed to be elongate along an ink flow direction 21, which is a right/left direction in FIG. 2. A portion of the vibrating film formation layer 10 that is a top roof portion of the pressure chamber 5 constitutes a vibrating film 10A. The vibrating film 10A (vibrating film formation layer 10) is constituted, for example, of a silicon oxide ($SiO_2$) film formed on the silicon substrate 2. The vibrating film 10A (vibrating film formation layer 10) may be constituted of a laminate, for example, of a silicon (Si) layer formed on the silicon substrate 2, a silicon oxide ($SiO_2$) layer formed on the silicon layer, and a silicon nitride (SiN) layer formed on the silicon oxide layer. In the present specification, the vibrating film 10A refers to the portion of the vibrating film formation layer 10 that is the top roof portion defining the pressure chamber 5. Therefore, portions of the vibrating film formation layer 10 besides the top roof portion of the pressure chamber 5 do not constitute the vibrating film 10A.

The vibrating film 10A has a thickness of, for example, 0.4 μm to 2 μm. If the vibrating film 10A is constituted of a silicon oxide film, the thickness of the silicon oxide film may be approximately 1.2 μm. If the vibrating film 10A is constituted of a laminate of a silicon layer, a silicon oxide layer, and a silicon nitride layer, the thickness of each of the silicon layer, the silicon oxide layer, and the silicon nitride layer may be approximately 0.4 μm.

The pressure chamber 5 is defined by the vibrating film 10A, the silicon substrate 2, and the nozzle substrate 3 and is formed to a substantially rectangular parallelepiped shape in the present preferred embodiment. The pressure chamber 5 may, for example, have a length of approximately 800 μm and a width of approximately 55 μm. The ink supply passages 4 are formed to be in communication with one end portion (an end portion positioned at an opposite side from the discharge port 3a in the present preferred embodiment) in a long direction of the pressure chamber 5. In the present preferred embodiment, the discharge port 3a of the nozzle substrate 3 is disposed near another end portion related to the long direction of the pressure chamber 5.

A piezoelectric element 6 is disposed on a front surface of the vibrating film 10A. The piezoelectric element 6 includes a lower electrode 7 formed on the vibrating film formation layer 10, a piezoelectric film 8 formed on the lower electrode 7, and an upper electrode 9 formed on the piezoelectric film 8. In other words, the piezoelectric element 6 is arranged by sandwiching the piezoelectric film 8 from above and below by the upper electrode 9 and the lower electrode 7.

The lower electrode 7 has, for example, a two-layer structure with a Ti (titanium) layer and a Pt (platinum) layer being laminated in that order from the vibrating film 10A side. Besides this, the lower electrode 7 may be formed of a single film that is an Au (gold) film, a Cr (chromium) layer, or an Ni (nickel) layer, etc. The lower electrode 7 has a main electrode portion 7A in contact with a lower surface of the piezoelectric film 8 and an extension portion 7B (see FIG. 1 and FIG. 4) extending to a region outside the piezoelectric film 8.

As the piezoelectric film 8, a PZT ($PbZr_xTi_{1-x}O_3$: lead zirconate titanate) film formed by a sol-gel method or a sputtering method may be applied. Such a piezoelectric film 8 is constituted of a sintered body of a metal oxide crystal. The piezoelectric film 8 preferably has a thickness of 1 μm to 5 μm. The overall thickness of the vibrating film 10A is preferably approximately the same as the thickness of the piezoelectric film 8 or approximately ⅔ the thickness of the piezoelectric film.

The upper electrode 9 is formed to have substantially the same shape in a plan view as the piezoelectric film 8. The upper electrode 9 has, for example, a three-layer structure in which an $IrO_2$ (iridium oxide) layer and an Ir (iridium) layer are laminated in that order from the piezoelectric film 8 side and a Pt layer or an Au layer, etc., is further laminated thereon.

A front surface of the vibrating film formation layer 10, a front surface of the piezoelectric element 6, and a front surface of the extension portion of the lower electrode 7 are covered with a hydrogen barrier film 13. The hydrogen barrier film 13 is constituted, for example, of $Al_2O_3$ (alumina). Degradation of characteristics of the piezoelectric film 8 due to hydrogen reduction can thereby be prevented. An insulating film 14 is laminated on the hydrogen barrier film 13. The insulating film 14 is constituted, for example, of $SiO_2$. A wiring 15 is formed on the insulating film 14. The wiring 15 is constituted of a metal material that includes Al (aluminum).

One end portion of the wiring 15 is disposed above one end portion of the upper electrode 9. A penetrating hole 16, penetrating continuously through the hydrogen barrier film 13 and the insulating film 14, is formed between the wiring 15 and the upper electrode 9. The one end portion of the wiring 15 enters into the penetrating hole 16 and is connected to the upper electrode 9 inside the penetrating hole 16. Also, the hydrogen barrier film 13 and the insulating film 14 have a cutout portion 17 at a position corresponding to a region surrounded by a peripheral edge portion of a front surface of the upper electrode 9. The cutout portion 17 is a portion at which the hydrogen barrier film 13 and the insulating film 14 are cut out.

Also, at a position corresponding to a predetermined region on the extension portion of the lower electrode 7, an opening 18, penetrating continuously through the hydrogen barrier film 13 and the insulating film 14, is formed and a front surface of the lower electrode 7 is exposed via the opening 18. The exposed portion constitutes a pad portion 7d arranged to connect the lower electrode 7 to the exterior. At a portion of the front surface of the vibrating film formation layer 10 further upstream than an upstream side end in the ink flow direction 21 of the piezoelectric element 6, the hydrogen barrier film 13 and the insulating film 14 are formed only in a region close to the upstream side end of the piezoelectric element 6 and the hydrogen barrier film 13 and the insulating film 14 are not formed further upstream thereof as viewed from a direction orthogonal to the ink flow direction 12 (a direction along a front surface of the silicon substrate 2).

The piezoelectric element 6 is formed at a position facing the pressure chamber 5 across the vibrating film 10A. That is, the piezoelectric element 6 is formed to contact a surface of the vibrating film 10A at the opposite side from the pressure chamber 5. The pressure chamber 5 is filled with ink supplied from an unillustrated ink tank through the ink supply passages 4. The vibrating film 10A defines a top surface portion of the pressure chamber 5 and faces the pressure chamber 5. The vibrating film 10A is supported by portions of the laminate of the vibrating film formation layer 10 and the silicon substrate 2 at a periphery of the pressure chamber 5 and has flexibility enabling deformation in a direction facing the pressure chamber 5 (in other words, in the thickness direction of the vibrating film 10A).

The wiring 15 and the pad portion 7d of the lower electrode 7 are connected to a drive circuit 20. The drive circuit 20 may be formed in a region of the silicon substrate 2 separate from the pressure chambers 5 or may be formed outside the silicon substrate 2. When a drive voltage is applied from the drive circuit 20 to the piezoelectric element 6, the piezoelectric film 8 deforms due to an inverse piezoelectric effect. The vibrating film 10A is thereby made to deform together with the piezoelectric element 6 to bring about a volume change of the pressure chamber 5 and the ink inside the pressure chamber 5 is pressurized. The pressurized ink passes through the ink discharge passage 3c and is discharged as microdroplets from the discharge port 3a.

Referring to FIG. 1 to FIG. 4, a plurality of the pressure chambers 5 are formed as stripes extending parallel to each other in the laminate of the silicon substrate 2 and the vibrating film formation layer 10. The plurality of pressure chambers 5 are formed at equal intervals that are minute intervals (for example, of approximately 30 μm to 350 μm) in a width direction thereof. In a plan view, each pressure chamber 5 has an oblong shape that is elongate along the ink flow direction 21 from the ink supply passages 4 to the discharge passage 3c. That is, the top surface portion of the pressure chamber 5 has two side edges 5c and 5d along the ink flow direction 21 and two end edges 5a and 5b along the direction orthogonal to the ink flow direction 21. At the one end portion of each pressure chamber 5, the ink supply passages 4 are divided and formed as two passages and are in communication with a common ink passage 19. The common ink passage 19 is in communication with the ink supply passages 4 corresponding to the plurality of pressure chambers 5 and is formed to supply the ink from the ink tank to the ink supply passages 4.

The piezoelectric element 6 has a rectangular shape in a plan view with which a length in the ink flow direction 21 (same direction as a long direction of the vibrating film 10A) is defined to be shorter than a length in the long direction of the vibrating film 10A. As shown in FIG. 1, respective end edges 6a and 6b along a short direction of the piezoelectric element 6 are disposed at inner sides at predetermined intervals d1 (for example, of 5 μm) from respective corresponding end edges 10Aa and 10Ab of the vibrating film 10A. Also, with the piezoelectric element 6, a width in the short direction (direction parallel to a major surface of the silicon substrate 2) orthogonal to the long direction of the vibrating film 10A is defined to be narrower than a width in the short direction of the vibrating film 10A (top surface portion of the pressure chamber 5). Respective side edges 6c and 6d along a long direction of the piezoelectric element 6 are disposed at inner sides at predetermined intervals d2 (for example, of 5 μm) from respective corresponding side edges 10Ac and 10Ad of the vibrating film 10A.

The lower electrode 7 has a flat plate shape, which, in a plan view has a predetermined width in a direction along the ink flow direction 21 and extends across the plurality of pressure chambers 5 in the direction orthogonal to the ink flow direction 21, and is a common electrode used in common for the plurality of piezoelectric elements 6. A first side 7a of the lower electrode 7 along the direction orthogonal to the ink flow direction 21 is matched in a plan view with a line joining the one end edge 6a of each of the plurality of piezoelectric elements 6. A second side 7b of the lower electrode 7 facing the first side 7a is disposed further outside (downstream in the ink flow direction 21) than the other end edges 10Ab of the vibrating films 10A corresponding to the other end edges 6b of the plurality of piezoelectric elements 6.

In the lower electrode 7, cutout portions 7c of rectangular shapes in a plan view that penetrate through the lower electrode 7 are formed at downstream sides in the ink flow direction 21 of the respective piezoelectric elements 6. In a plan view, each cutout portion 7c has two side edges (short sides) along the ink flow direction 21 and two end edges (long sides) along the direction orthogonal to the ink flow direction 21. One end edge of the cutout portion 7c is disposed at a position matching the end edge 6b of the piezoelectric element 6 in relation to the ink flow direction 21 and the other end edge is disposed further outside (downstream in the ink flow direction 21) than the end edge 10Ab of the vibrating film 10A. One side edge of the cutout portion 7c is disposed further outside than the one side edge 10Ac of the vibrating film 10A and the other side edge of the cutout portion 7c is disposed further outside than the other side edge 10Ad of the vibrating film 10A. Therefore in a plan view, an end portion of the vibrating film 10A at the end edge 10Ab side is disposed at an inner side of the cutout portion 7c. The pad portion 7d of rectangular shape that is elongate in the direction orthogonal to the ink flow direction 21 is formed in a region between the second side 7b of the lower electrode 7 and the plurality of cutout portions 7c.

The lower electrode 7 includes the main electrode portions 7A that constitute the piezoelectric elements 6 and the extension portion 7B lead out from the main electrode portions 7A in a direction along the front surface of the vibrating film formation layer 10 to cross over peripheral edges of the top surface portions (vibrating films 10A) of the pressure chambers 5 and extend outside the peripheral edges of the top surface portions of the pressure chambers 5. Each main electrode portion 7A is formed to be shorter than the vibrating film 10A in the long direction of the vibrating film 10A and respective end edges thereof are disposed at inner sides at the predetermined intervals d1 from the respective corresponding end edges 10Aa and 10Ab of the vibrating film 10A. Also with the main electrode portion 7A, a width along the short direction of the vibrating film 10A is defined to be narrower than the width in the short direction of the vibrating film 10A and respective side edges thereof are disposed at inner sides at the intervals d2 from the respective corresponding side edges 10Ac and 10Ad of the vibrating film 10A.

Figure 5:
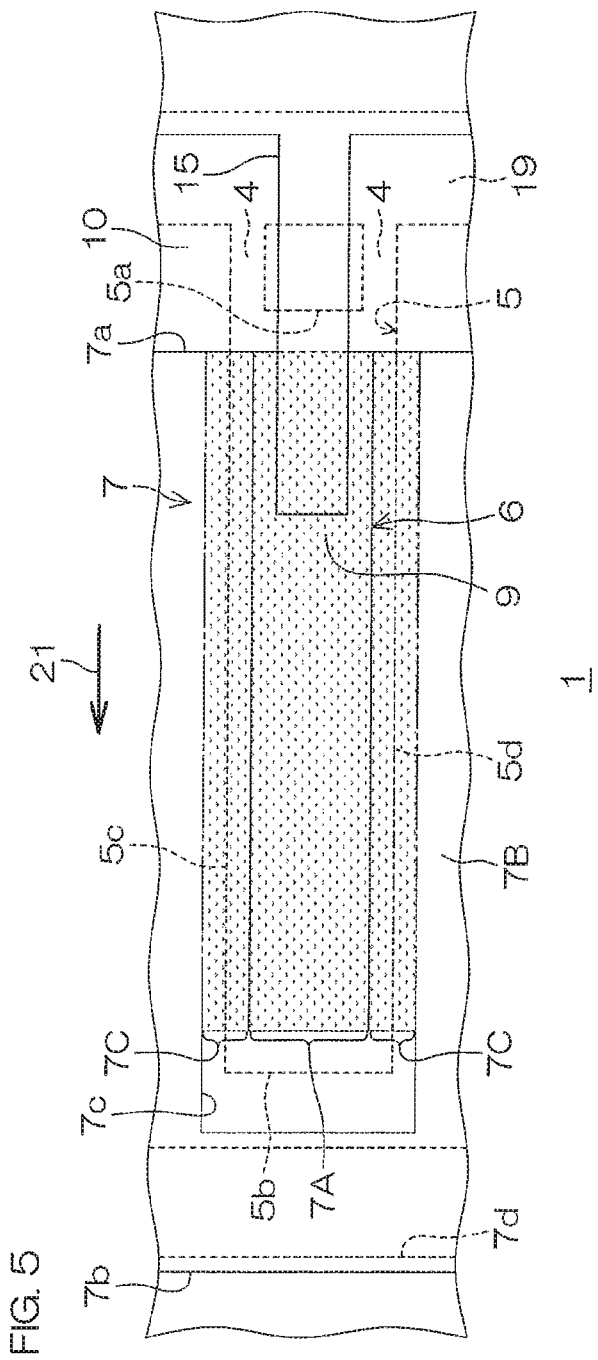
FIG. 5 is a partially enlarged plan view of FIG. 1.

In a plan view, the extension portion 7B extends from the respective side edges of each main electrode portion 7A to the outside of the corresponding side edges 5c and 5d of the top surface portion of the pressure chamber 5 upon crossing over the side edges 5c and 5d of the top surface portion of the pressure chamber 5. Of all regions of the lower electrode 7, the extension portion 7B is the region excluding the main electrode portions 7A. Referring to FIG. 5, each portion in the extension portion 7B that crosses over a peripheral edge (the side edge 5c or 5d in the present preferred embodiment) of the pressure chamber 5 may be referred to at times as a "crossover region 7C." Also in the lower electrode 7, a region at the inner side of the peripheral edges 5a to 5d of the top surface portion of the pressure chamber 5 in a plan view may be referred to at times as an "inner electrode region" and a region at the outer side of the peripheral edges 5a to 5d of the top surface portion of the pressure chamber 5 may be referred to at times as an "outer electrode region."

Each main electrode portion 7A in the lower electrode 7 is included in an inner electrode region. The extension portion 7B in the lower electrode 7 is constituted of the outer electrode region and regions of the inner electrode regions besides the main electrode portions 7A. The crossover regions 7C are regions in vicinities of boundary portions between the inner electrode regions and the outer electrode region. In the present preferred embodiment, boundary lines between each inner electrode region and the outer electrode region include two boundary lines corresponding to intermediate length portions of the respective side edges 5c and 5d of the top surface portion of the pressure chamber 5. Therefore, in the present preferred embodiment, the lower electrode 7 has two crossover regions 7C respectively crossing over the intermediate length portions of the respective side edges 5c and 5d of the top surface portion of the pressure chamber 5 in a plan view.

With the present preferred embodiment, a thickness of each crossover region 7C in the lower electrode 7 and a portion of each inner electrode region excluding the crossover regions 7C is defined to be thinner than a thickness of a region besides the above. That is, with the present preferred embodiment, the lower electrode 7 has a thin portion corresponding to each crossover region 7C, a thin portion corresponding to a region of each inner electrode region excluding the crossover regions 7C, and a thick portion corresponding to a region besides these regions. The thin portions of the lower electrode 7 are indicated as a dotted region in FIG. 5. With the present preferred embodiment, a width of a region in each crossover region 7C belonging to the inner electrode region is set to be of the same width as a width of a region in the inner electrode region between the corresponding side edge of the inner electrode region and the corresponding side edge of the main electrode portion 7A. Therefore, with the present preferred embodiment, the lower electrode 7 has the thin portion corresponding to each crossover region 7C, a thin portion corresponding to each main electrode portion 7A, and a thick portion corresponding to a region besides these regions. The width of the region in each crossover region 7C belonging to the inner electrode region may be set to be of shorter width than the width of the region in the inner electrode region between the corresponding side edge of the inner electrode region and the corresponding side edge of the main electrode portion 7A.

Referring to FIG. 1 to FIG. 4, the upper electrode 9 is formed to be shorter than the vibrating film 10A along the long direction of the vibrating film 10A and respective end edges thereof are disposed at inner sides at the predetermined intervals d1 from the respective corresponding end edges 10Aa and 10Ab of the vibrating film 10A. Also with the upper electrode 9, a width along the short direction of the vibrating film 10A is defined to be narrower than the width in the short direction of the vibrating film 10A and respective side edges thereof are disposed at inner sides at the intervals d2 from the respective corresponding side edges 10Ac and 10Ad of the vibrating film 10A.

The piezoelectric film 8 is formed in the same pattern as the upper electrode 9. That is, the piezoelectric film 8 is formed to be shorter than the vibrating film 10A along the long direction of the vibrating film 10A and respective end edges thereof are disposed at inner sides at the predetermined intervals d1 from the respective corresponding end edges 10Aa and 10Ab of the vibrating film 10A. Also with the piezoelectric film 8, a width along the short direction of the vibrating film 10A is defined to be narrower than the width in the short direction of the vibrating film 10A and respective side edges thereof are disposed at inner sides at the intervals d2 from the respective corresponding side edges 10Ac and 10Ad of the vibrating film 10A. A lower surface of the piezoelectric film 8 contacts an upper surface of the portion of the lower electrode 7 that constitutes the piezoelectric element 6 and an upper surface of the piezoelectric film 8 contacts a lower surface of the upper electrode 9.

Each wiring 15 is constituted of a lead-out portion 15A, having one end portion connected to one end portion (an end portion at the one end edge 6a side of the piezoelectric element 6) of the upper electrode 9 and extending in a direction opposite to the ink flow direction 21 in a plan view, and a pad portion 15B of rectangular shape in a plan view that is made integral to the lead-out portion 15A and connected to a tip of the lead-out portion 15A. With the exception of a portion connected to the upper electrode 9, the lead-out portion 15A is formed on a front surface of the insulating film 14 that covers one end portion (an end portion at the one end edge 6a side of the piezoelectric element 6) of an upper surface of the piezoelectric element 6, an end surface of the piezoelectric element 6 continuous thereto, and the front surface of the vibrating film formation layer 10. The pad portion 15B is formed on a portion of the front surface of the vibrating film formation layer 10 at which the hydrogen barrier film 13 and the insulating film 14 are not formed.

An annular region (a rectangular annular region that is long in the ink flow direction 21 in the present preferred embodiment) in the vibrating film 10A between the peripheral edges 10Aa to 10Ad of the vibrating film 10A and the peripheral edges 6a to 6d of the piezoelectric element 6 is a region that is not constrained by the piezoelectric element 6 or a peripheral wall of the pressure chamber 5 and is a region in which a large deformation occurs. That is, a peripheral edge portion of the vibrating film 10A is a region in which a large deformation occurs. Therefore, when the piezoelectric element 6 is driven, the peripheral edge portion of the vibrating film 10A bends so that an inner peripheral edge side of the peripheral edge portion of the vibrating film 10A is displaced in a thickness direction of the pressure chamber 5 (downward in the present preferred embodiment) and an entirety of a central portion surrounded by the peripheral edge portion of the vibrating film 10A is thereby displaced in the thickness direction of the pressure chamber 5 (downward in the present preferred embodiment).

A portion of each crossover region 7C of the lower electrode 7 that is located further inward than the top surface portion peripheral edges 5a to 5d (the side edges 5c and 5d of the top surface portion in the present preferred embodiment) of the pressure chamber 5 is formed on the peripheral edge portion of the vibrating film 10A. The crossover region 7C of the lower electrode 7 may thus obstruct the deformation of the vibrating film 10A. With the present preferred embodiment, the lower electrode 7 has the thin portions corresponding to the crossover regions 7C and therefore the deformation of the vibrating film 10A is made less likely to be obstructed in comparison to a case where the entire lower electrode 7 is thick in thickness. Also with the present preferred embodiment, the lower electrode 7 has, in addition to the thin portions corresponding to the crossover regions 7C, the thin portion corresponding to the region of each inner electrode region excluding the crossover regions 7C (each main electrode portion 7A in the present preferred embodiment), and therefore the deformation of the vibrating film 10A is made even less likely to be obstructed.

Also with the present preferred embodiment, the lower electrode 7 has the thick portion corresponding to the region excluding the crossover regions 7C and the region of each inner electrode region excluding the crossover regions 7C (each main electrode portion 7A in the present preferred embodiment), and the lower electrode 7 can thus be decreased in resistance value compared to a case where the entire lower electrode 7 is thin in thickness. That is, with the present preferred embodiment, the lower electrode 7 can be made low in resistance value and the vibrating film 10A can be made large in displacement.

Figure 6:
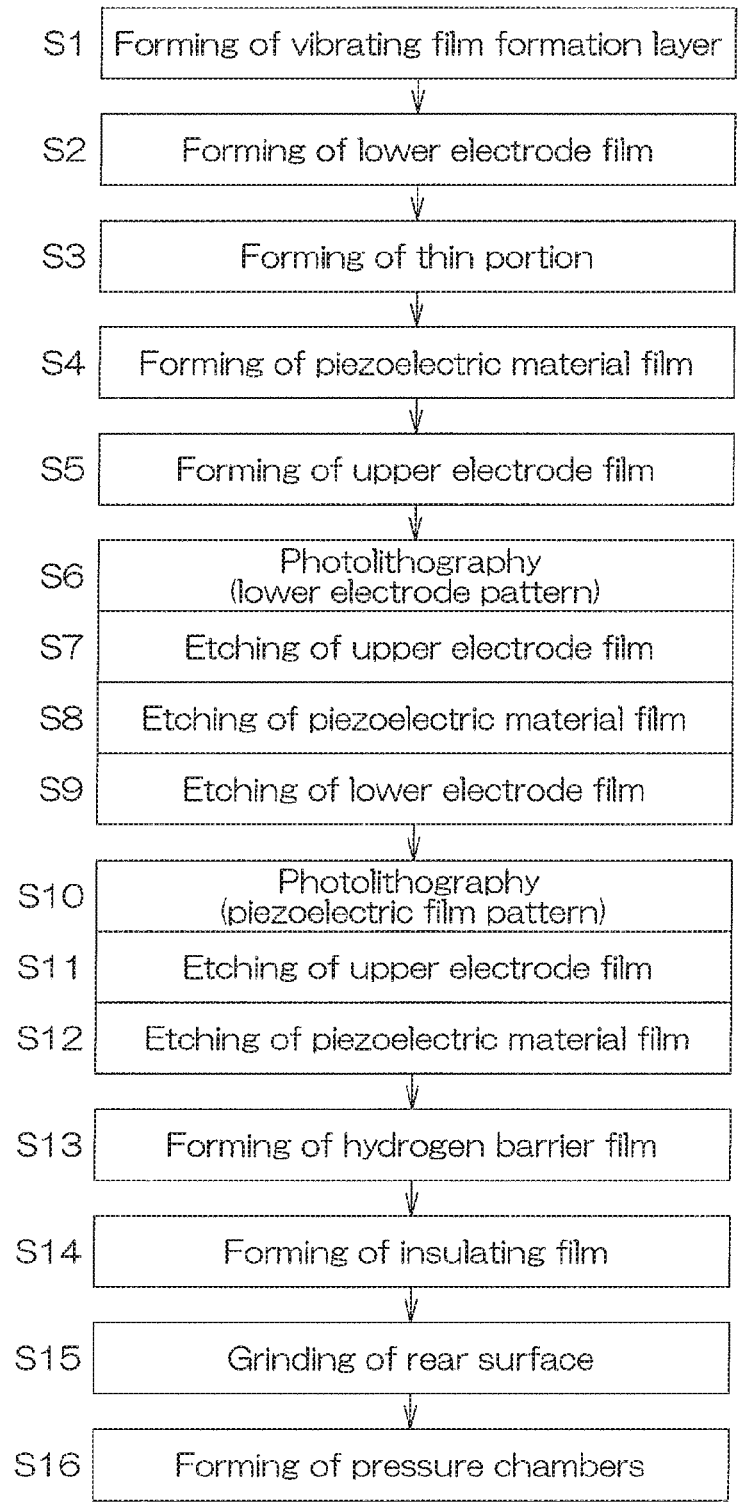
FIG. 6 is a process diagram of an example of a process for manufacturing the inkjet printing head.

FIG. 6 is a process diagram of an example of a process for manufacturing the inkjet printing head 1.

First the vibrating film formation layer 10 is formed on the front surface of the silicon substrate 2 (S1). Specifically, a silicon oxide layer (for example, of 1.2 μm thickness) is formed on the front surface of the silicon substrate 2. If the vibrating film formation layer 10 is constituted of a laminate of a silicon layer, a silicon oxide layer, and a silicon nitride layer, the silicon layer (for example, of 0.4 μm thickness) is formed on the front surface of the silicon substrate 2, the silicon oxide layer (for example, of 0.4 μm thickness) is formed on the silicon layer, and the silicon nitride layer (for example, of 0.4 μm thickness) is formed on the silicon oxide layer. A base oxide film, for example, of $Al_2O_3$, MgO, or $ZrO_2$, etc., may be formed on the front surface of the vibrating film formation layer 10. Such base oxide films prevent metal atoms from escaping from the piezoelectric film 8 that is to be formed later. When metal atoms escape, the piezoelectric film 8 may degrade in piezoelectric characteristics. Also, when metal atoms that have escaped become mixed in the silicon layer constituting the vibrating film 10A, the vibrating film 10A may degrade in durability.

Next, a lower electrode film, which is a material layer of the lower electrode 7, is formed above the vibrating film formation layer 10 (above the base oxide film in the case where the base oxide film is formed) (S2). The lower electrode film is constituted, for example, of a Pt/Ti laminated film having a Ti film (for example, of 100 Å to 400 Å thickness) as a lower layer and a Pt film (for example, of 100 Å to 4000 Å thickness) as an upper layer. Such a lower electrode film may be formed by a sputtering method.

Next, thin portions of the lower electrode film are formed (S3). That is, a resist mask, covering a region besides regions that are to become the thin portions of the lower electrode 7 (the crossover regions 7C of the lower electrode 7 and the regions of the inner electrode regions excluding the crossover regions 7C), is formed by photolithography, and the lower electrode film is etched using the resist mask as a mask to form the thin portions of the lower electrode 7. The thickness of the thin portions is, for example, approximately 1000 Å and the thickness of the portion (thick portion) besides the thin portions is, for example, approximately 2000 Å.

Next, a material film (piezoelectric material film) of the piezoelectric film 8 is formed on an entire surface of the lower electrode film (S4). Specifically, for example, a PZT film of 1 μm to 5 μm thickness is formed by a sol-gel method. Such a PZT film is constituted of a sintered body of metal oxide crystal grains.

Next, an upper electrode film, which is a material of the upper electrode 9 is formed on the entire surface of the piezoelectric material film (step S5). The upper electrode film is constituted, for example, of an $Ir/IrO_2$ laminated film having an $IrO_2$ film (for example, of 400 Å to 1600 Å thickness) as a lower layer and an Ir film (for example, of 500 Å to 2000 Å thickness) as an upper layer. Such an upper electrode film may be formed by the sputtering method.

Next, patterning of the upper electrode film, the piezoelectric material film, and the lower electrode film is performed (S6 to S12). First, a resist mask with a pattern of the lower electrode 7 is formed by photolithography (S6) and the upper electrode film, the piezoelectric material film, and the lower electrode film are etched in the same pattern using the resist mask as a mask to form a lower electrode film of a predetermined pattern (steps S6 to S9). More specifically, the upper electrode film is patterned by dry etching (step S7), the piezoelectric material film is patterned by wet etching (S8), and the lower electrode film is patterned by dry etching (step S9). The lower electrode 7 is thereby formed. The etchant used for wet etching of the piezoelectric material film may be an acid having hydrochloric acid as a main component.

After then peeling off the resist mask, a resist mask with a pattern of the piezoelectric films 8 is formed by photolithography (S10) and the upper electrode film and the piezoelectric material film are etched in the same pattern using the resist pattern (S11 to S12). More specifically, the upper electrode film is patterned by dry etching (S11), and the piezoelectric material film is patterned by wet etching (S12). The piezoelectric films 8 and the upper electrodes 9 are thereby formed.

Thereafter, the resist mask is peeled off and then the hydrogen barrier film 13 covering the entire surface is formed (S13). The hydrogen barrier film 13 may be an $Al_2O_3$ film formed by the sputtering method and may have a film thickness of 400 Å to 1600 Å.

Further, the insulating film 14 covering the hydrogen barrier film 13 is formed (S14). The insulating film 14 may be an $SiO_2$ film and may have a film thickness of 2500 Å to 10000 Å.

Next, rear surface grinding for thinning the silicon substrate 2 is performed (S15). For example, the silicon substrate 2 with a thickness of approximately 670 μm in the initial state may be thinned to a thickness of approximately 300 μm.

Thereafter, etching (dry etching or wet etching) from the rear surface of the silicon substrate 2 is performed on the laminate of the silicon substrate 2 and the vibrating film formation layer 10 to form the pressure chambers 5 and form the vibrating films 10A at the same time (S16). In the etching process, the hydrogen barrier film 13 and the base oxide film formed on the front surface of the vibrating film formation layer 10 prevents the escaping of metal elements (Pb, Zr, and Ti in the case of PZT) from the piezoelectric film 8 and keeps the piezoelectric characteristics of the piezoelectric film 8 in a satisfactory state. Also as mentioned above, the base oxide film formed on the front surface of the vibrating film formation layer 10 contributes to maintaining the durability of silicon layer that forms the vibrating film 10A.

Thereafter, patterning of the hydrogen barrier film 13 and the insulating film 14, forming of the wirings 15, etc., are performed and the inkjet printing head 1 shown in FIG. 1 to FIG. 4 is thereby obtained.

Figure 7:
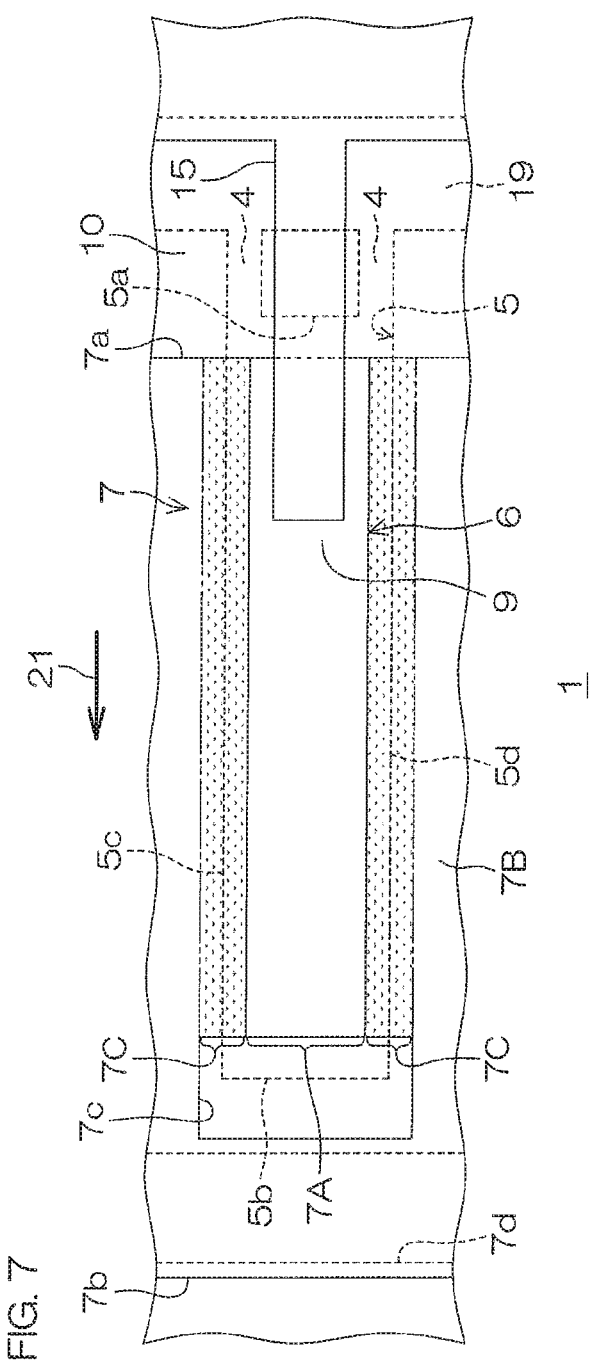
FIG. 7 is a plan view for describing the arrangement of an inkjet printing head according to another preferred embodiment of the present invention.
Figure 8:
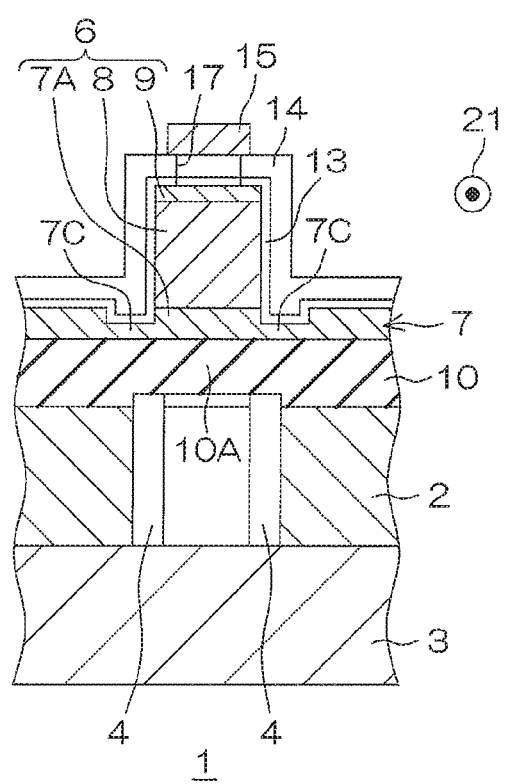
FIG. 8 is a sectional view for describing the arrangement of the inkjet printing head of FIG. 7.

With the present preferred embodiment, the thickness of each crossover region 7C of the lower electrode 7 and the region of each inner electrode region excluding the crossover regions 7C (each main electrode portion 7A in the present preferred embodiment) is defined to be thinner than the other region. However, as shown in FIG. 7 and FIG. 8, the thickness of the region of each inner electrode region excluding the crossover regions 7C (each main electrode portion 7A in the present preferred embodiment) may be defined to be thicker than the thickness of the crossover regions 7C. In other words, in the lower electrode 7, just the crossover regions 7C may be formed to be thinner in thickness than the other regions. That is, the lower electrode 7 may have thin portions corresponding to the crossover regions 7C and thick portions corresponding to regions besides the crossover regions 7C. The thin portions of the lower electrode 7 in this case are indicated by dotted regions in FIG. 7.

Even with such an arrangement, the resistance value of the lower electrode 7 can be made small and the displacement of the vibrating film 10A can be made large. Also with this arrangement, the thickness of each main electrode portion 7A is defined to be thicker than the thickness of each thin portion corresponding to each crossover region 7C and therefore the resistance value of the lower electrode 7 can be decreased further.

Even with the arrangement shown in FIG. 7 and FIG. 8, the width of the region in each crossover region 7C belonging to the inner electrode region may be set to be of shorter width than the width of the region in the inner electrode region between the corresponding side edge of the inner electrode region and the corresponding side edge of the main electrode portion 7A. In such a case, the thickness of regions in each inner electrode region between the main electrode portion 7A and the crossover regions 7C may be defined to be as thin as the crossover regions 7C or may be defined to be as thick as the main electrode portion 7A.

Figure 9:
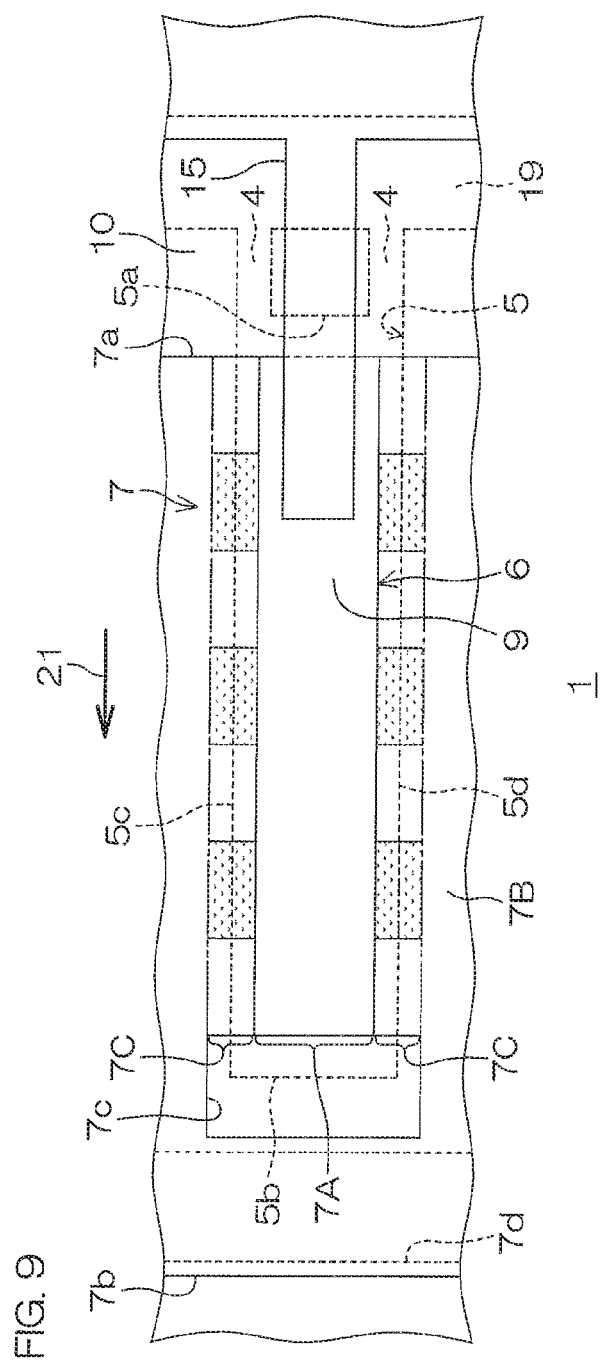
FIG. 9 is a plan view for describing the arrangement of an inkjet printing head according to yet another preferred embodiment of the present invention.

With the preferred embodiment described above, the entirety of each crossover region 7C is formed thinly. However, the entirety of each crossover region 7C does not have to be formed thinly and just a portion of the crossover region 7C in the long direction (direction along the side edges 5c and 5d of the top surface portion of the pressure chamber 5) may be formed thinly. In other words, the thickness of just a portion of each crossover region 7C in the lower electrode 7 may be defined to be thinner than the thickness of other regions. For example, as shown in FIG. 9, each crossover region 7C may have an arrangement where rectangular thin portions and thick portions having long directions along the side edges 5c and 5d of the top surface portion of each pressure chamber 5 are formed alternately along the long direction thereof. In FIG. 9, the rectangular thin portions in the crossover regions 7C are indicated by dotted regions.

Further, the lower electrode 7 may have, in addition to or in place of crossover regions (hereinafter referred to as the "first crossover regions 7C") crossing over the side edges 5c and 5d of the top surface portion of each pressure chamber 7, crossover regions ((hereinafter referred to as the "second crossover regions 7C") crossing over the end edges 5a and 5b of the top surface portion of each pressure chamber 7 in a plan view. When the lower electrode 7 has the second crossover regions in addition to the first crossover regions, at least a portion of each of the first crossover regions and the second crossover regions in a direction along the peripheral edges 5a to 5d of the top surface portion of the pressure chamber 5 is formed to be thin in thickness. When the lower electrode 7 has the second crossover regions in place of the first crossover regions, at least a portion of each of the second crossover regions in a direction along the end edges 5a and 5b of the top surface portion of the pressure chamber 5 is formed to be thin in thickness. Even in these cases, the thickness of a region in a portion (inner electrode region) of the lower electrode 7 disposed at the inner side of the top surface portion peripheral edges 5a to 5d of each pressure chamber 5 in a plan view and excluding the crossover regions 7C may be formed to be thin in thickness.

An arrangement example of the piezoelectric film 8 used in the inkjet printing head 1 shall now be described.

FIG. 10 is a schematic sectional view of the piezoelectric film 8. The piezoelectric film 8 is formed to be in contact with the front surface of the lower electrode (metal film) 7 formed on the silicon substrate 2. More specifically, the vibrating film formation layer 10 is formed on the front surface of the silicon substrate 2, the lower electrode 7 is formed on the front surface of the vibrating film formation layer 10, and the piezoelectric film 8 is formed on the front surface of the lower electrode 7. In the present preferred embodiment, the lower electrode 7 is constituted of the Pt/Ti laminated film having the Ti film as the lower layer and the Pt film as the upper layer. The upper electrode 9 is formed on the upper surface of the piezoelectric film 8. The upper electrode 9 is constituted of the Ir/IrO$_2$ laminated film having the IrO$_2$ film as the lower layer and the Ir film as the upper layer.

The piezoelectric film 8 includes an adhesion layer 101 formed on the front surface of the lower electrode 7, a first seed layer 102 formed on the adhesion layer 101, a plurality of main baking unit PZT layers 103 to 106 laminated on the first seed layer 102, a second seed layer 107 formed on the front surface of the main baking unit PZT 106, and a plurality of main baking unit PZT layers 108 to 112 formed on the front surface of the second seed layer 107.

"Main baking unit PZT layer" refers to a PZT layer formed by performing, once or a plurality of times, a gelled film forming process, constituted of a coating process of coating on a precursor solution, containing PZT, a drying process of drying the coating film, and a prebaking process of heating the coating film after the drying process to make the coating film undergo gelling, and thereafter performing a main baking process of heat-treating and thereby sintering the gelled coating film. That is, the main baking unit PZT layers are formed by the sol-gel method.

The precursor solution contains a solvent in addition to PZT. In the coating process, the precursor solution is, for example, spin-coated. The drying process is performed under a temperature environment, for example, of 140° C. The drying process may be a natural drying process. In the prebaking process, heat treatment, for example, at a temperature (for example, of 400° C.) not less than the melting point (327.5° C.) of lead is performed on the coating film after the drying process. Heat treatment at a temperature (for example, of 300° C.) less than the melting point of lead may be performed in the prebaking process. In the main baking process, heat treatment, for example, at a temperature of 700° C. is performed on the gelled coating film. The main baking process may be performed by RTA (rapid thermal annealing).

In the description that follows, PZT layers respectively corresponding to one or a plurality of coating film layers that are sintered at the same time in the main baking process may be referred to at times as the "prebaking unit PZT layers."

The adhesion layer 101 is a layer provided to improve adhesion of the piezoelectric film 8 and the lower electrode 7 and is constituted of a TiO layer in the present preferred embodiment. The TiO layer may be formed, for example, by the sol-gel method, the sputtering method, etc.

Each of the seed layers 102 and 107 is a layer provided to improve crystallinity and adhesion of PZT and is arranged, for example, from a PZT seed layer constituted of PZT or a TiO seed layer constituted of TiO. The first seed layer 102 and the second seed layer 107 may be arranged from the same material or may be arranged from mutually different materials. To form a PZT seed layer, the gelled film forming process, constituted of the coating process of coating on the precursor solution, containing PZT, the drying process of drying the coating film, and the prebaking process of heating the coating film after the drying process to make the coating film undergo gelling, is performed once and thereafter the main baking process of heat-treating and thereby sintering the gelled coating film is performed. A TiO seed layer may be formed, for example, by the sol-gel method, the sputtering method, etc.

With the arrangement example of FIG. 10, four main baking unit PZT layers 103 to 106 are laminated between the first seed layer 102 and the second seed layer 107, and five main baking unit PZT layers 108 to 112 are laminated on the second seed layer 107.

Among the main baking unit PZT layers 103 to 106 and 108 to 112, each of the main baking unit PZT layers 103 to 106 and 108 to 111 besides the uppermost main baking unit PZT layer 112 is formed by performing the gelled film forming process, constituted of the coating process of coating on the precursor solution, containing PZT, the drying process of drying the coating film, and the prebaking process of heating the coating film after the drying process to make the coating film undergo gelling, a plurality of times, three times in the present preferred embodiment, and thereafter performing the main baking process of heat-treating and thereby sintering the gelled coating film. Therefore, each of the main baking unit PZT layers 103 to 106 and 108 to 111 besides the uppermost main baking unit PZT layer 112 includes three prebaking unit PZT layers 100. A single prebaking unit PZT layer 100 has a thickness of 0.08 μm in the present preferred embodiment.

On the other hand, uppermost main baking unit PZT layer 112 is formed by performing the gelled film forming process, constituted of the coating process of coating on the precursor solution, containing PZT, the drying process of drying the coating film, and the prebaking process of heating the coating film after the drying process to make the coating film undergo gelling, once and thereafter performing the main baking process of heat-treating and thereby sintering the gelled coating film. Therefore, the uppermost main baking unit PZT layer includes one prebaking unit PZT layer 100.

The greater the number of coating film layers that are sintered at the same time in the main baking process, that is, the greater the number of prebaking unit PZT layers included in a main baking unit PZT layer, the less the number of times the main baking process is performed as a whole and therefore the higher the manufacturing efficiency. However, the greater the number of coating film layers that are sintered at the same time in the main baking process, the thicker the overall thickness of the coating films that are sintered by the main baking process and therefore the greater the unevenness of the front surface (upper surface) of the main baking unit PZT layer that is formed after the main baking process.

With the arrangement example of FIG. 10, whereas three prebaking unit PZT layers are included in each of the main baking unit PZT layers 103 to 106 and 108 to 111 besides the uppermost main baking unit PZT layer 112, one prebaking unit PZT layer is included in the uppermost main baking unit PZT layer 112. The unevenness of the front surface of the uppermost main baking unit PZT layer 112 is thus small in comparison to the unevenness of the front surface of each of the other main baking unit PZT layers 103 to 106, 108 to 111. Consequently, the unevenness of the front surface of the uppermost main baking unit PZT layer 112 is smaller than the unevenness of an interface between the main baking unit PZT layer 112 and the adjacent main baking unit PZT layer 111 that is second from the top. The piezoelectric film 8 with a smooth uppermost surface is thereby obtained. Adhesion of the piezoelectric film 8 and the upper electrode 9 can thereby be improved. Also, parallelism between the lower electrode 7 and the upper electrode 9 can be improved and the piezoelectric film can thus be improved in piezoelectric performance.

Also with the arrangement example of FIG. 10, the piezoelectric film 8 includes, in addition to the first seed layer 102 present at the lower surface side of the lowermost main baking unit PZT layer 103, the second seed layer 107 interposed between the mutually adjacent main baking unit PZT layers 106 and 108 at an intermediate position between the lowermost main baking unit PZT layer 103 and the uppermost main baking unit PZT layer 112. Therefore in comparison to a case where a seed layer is provided just at the lower surface side of the lowermost main baking unit PZT layer 103, directions of crystals of the respective main baking unit PZT layers 103 to 106 and 108 to 112 are aligned more readily. The piezoelectric film 8 having stable piezoelectric characteristics is thereby obtained.

Such a piezoelectric film 8 is formed as follows. First, the adhesion layer 101 is formed on the lower electrode 7 and the first seed layer 102 is formed on the adhesion layer 101. Thereafter, the lowermost main baking unit PZT layer 103 is formed on the first seed layer 102 and the second to fourth main baking unit PZT layers 104 to 106 are formed successively thereon. Thereafter, the second seed layer 107 is formed on the fourth main baking unit PZT layer 106. Thereafter, the fifth main baking unit PZT layer 108 is formed on the second seed layer 107 and the sixth to eighth main baking unit PZT layers 109 to 111 are formed successively thereon. Lastly, the uppermost (ninth) main baking unit PZT layer 112 is formed on the eighth main baking unit PZT layer 111.

Examples of the piezoelectric film 8 shall now be described.

First Example

In a first example, the first seed layer 102 and the second seed layer 107 are arranged from PZT seed layers constituted of PZT. In the first example, the first seed layer 102 and the second seed layer 107 are arranged from the same material and therefore the manufacturing efficiency can be improved.

Second Example

In a second example, the first seed layer 102 and the second seed layer 107 are arranged from TiO seed layers constituted of TiO. In the second example, the first seed layer 102 and the second seed layer 107 are arranged from the same material and therefore the manufacturing efficiency can be improved.

Third Example

In a third example, the first seed layer 102 is arranged from a TiO seed layer constituted of TiO and the second seed layer 107 is arranged from a PZT seed layer constituted of PZT.

Fourth Example

In a fourth example, the first seed layer 102 is arranged from a PZT seed layer constituted of PZT and the second seed layer 107 is arranged from a TiO seed layer constituted of TiO.

With the arrangement example of FIG. 10, three prebaking unit PZT layers are included in each of the main baking unit PZT layers 103 to 106 and 108 to 111 besides the uppermost main baking unit PZT layer 112. However, it suffices that not less than two prebaking unit PZT layers are included in the second main baking unit PZT layer 111 from the top that is adjacent to the uppermost main baking unit PZT layer 112 and the number of prebaking unit PZT layers included in each of the lower main baking unit PZT layers 103 to 106 and 108 to 110 may be one or a plural number other than three.

Also, the number of main baking unit PZT layers included in the piezoelectric film 8 is not restricted to the number of layers in the arrangement example of FIG. 10 and may be set to any number as long as it is not less than two. Also, the thickness of the prebaking unit PZT layer is not restricted to the thickness in the arrangement example of FIG. 10 and may be set to any thickness.

Also, although with the arrangement example of FIG. 10, the second seed layer 107 is provided only at a single predetermined intermediate position between the lowermost main baking unit PZT layer 103 and the uppermost main baking unit PZT layer 112, second seed layers may be provided at a plurality of different intermediate positions.

Also, although with the preferred embodiments described above, cases where the present invention is applied to an inkjet printing head was described, the present invention may also be applied to a microphone, pressure sensor, acceleration sensor, angular velocity sensor, ultrasonic sensor, speaker, or IR sensor (heat sensor), etc., that uses a piezoelectric element.

Besides the above, various design changes may be applied within the scope of the matters described in the claims.

The following further features can be extracted from the present specification.

A1. A piezoelectric film including a plurality of laminated main baking unit PZT layers, a first seed layer present at a lower surface side of a lowermost main baking unit PZT layer, and a second seed layer interposed between two adjacent main baking unit PZT layers at an intermediate position between the lowermost main baking unit PZT layer and an uppermost main baking unit PZT layer.

"Main baking unit PZT layer" refers to a PZT layer formed by performing, once or a plurality of times, a gelled film forming process, constituted of a coating process of coating on a precursor solution, containing PZT, a drying process of drying the coating film, and a prebaking process of heating the coating film after the drying process to make the coating film undergo gelling, and thereafter performing a main baking process of heat-treating and thereby sintering the gelled coating film.

With the present arrangement, the seed layer is present not only at the lower surface side of the lowermost main baking unit PZT layer but also at the intermediate position between the lowermost main baking unit PZT layer and the uppermost main baking unit PZT layer. Therefore in comparison to a piezoelectric film in which a seed layer is provided just at the lower surface side of the lowermost main baking unit PZT layer, directions of crystals of the respective main baking unit PZT layers are aligned more readily. The piezoelectric film having stable piezoelectric characteristics is thereby obtained.

A2. The piezoelectric film according to "A1.," where the first seed layer and the second seed layer are arranged from the same material. With this arrangement, the manufacturing efficiency of the piezoelectric film can be improved.

A3. The piezoelectric film according to "A2.," where the first seed layer and the second seed layer are arranged from PZT seed layers constituted of PZT.

A4. The piezoelectric film according to "A2.," where the first seed layer and the second seed layer are arranged from TiO seed layers constituted of titanium oxide.

A5. The piezoelectric film according to "A1.," where the first seed layer and the second seed layer are arranged from different materials.

A6. The piezoelectric film according to "A5.," where the first seed layer is arranged from a TiO seed layer constituted of titanium oxide and the second seed layer is arranged from a PZT seed layer constituted of PZT.

A7. The piezoelectric film according to "A5.," where the first seed layer is arranged from a PZT seed layer constituted of PZT and the second seed layer is arranged from a TiO seed layer constituted of titanium oxide.

A8. The piezoelectric film according to any one of "A3.," "A6.," or "A7.," where the PZT seed layer is formed by performing a gelled film forming process, constituted of a coating process of coating on a precursor solution, containing PZT, a drying process of drying the coating film, and a prebaking process of heating the coating film after the drying process to make the coating film undergo gelling, once and thereafter performing a main baking process of heat-treating and thereby sintering the gelled coating film.

A9. A piezoelectric element including a lower electrode, the piezoelectric film according to any one of "A1." to "A8." that is formed on the lower electrode, and an upper electrode formed on the piezoelectric film. With this arrangement, the piezoelectric element having stable piezoelectric characteristics is obtained.

A10. An inkjet printing head including a cavity, a vibrating film disposed on the cavity and defining a top surface portion of the cavity, and the piezoelectric element according to "A9." that is formed on the vibrating film. With this arrangement, the inkjet printing head that can realize stable driving characteristics can be provided by the use of the piezoelectric element having stable piezoelectric characteristics.

Also, the following further features can be extracted from the present specification.

B1. A piezoelectric film including a plurality of laminated main baking unit PZT layers and where an unevenness of a front surface of an uppermost main baking unit PZT layer is smaller than an unevenness of an interface between the uppermost main baking unit PZT layer and a main baking unit PZT layer that is adjacent thereto and is second from the top.

"Main baking unit PZT layer" refers to a PZT layer formed by performing, once or a plurality of times, a gelled film forming process, constituted of a coating process of coating on a precursor solution, containing PZT, a drying process of drying the coating film, and a prebaking process of heating the coating film after the drying process to make the coating film undergo gelling, and thereafter performing a main baking process of heat-treating and thereby sintering the gelled coating film. By the present arrangement, the piezoelectric film with a smooth uppermost surface can be obtained.

B2. The piezoelectric film according to "B1.," where a thickness of the uppermost main baking unit PZT layer is thinner than a thickness of the main baking unit PZT layer that is second from the top. By the present arrangement, the piezoelectric film with a smooth uppermost surface can be obtained.

B3. The piezoelectric film according to "B1." or "B2.," where the uppermost main baking unit PZT layer is formed by performing a gelled film forming process, constituted of a coating process of coating on a precursor solution, containing PZT, a drying process of drying the coating film, and a prebaking process of heating the coating film after the drying process to make the coating film undergo gelling, once and thereafter performing a main baking process of heat-treating and thereby sintering the gelled coating film.

With a main baking unit PZT layer, which is formed by performing the gelled film forming process, constituted of the coating process, the drying process, and the prebaking process, once and thereafter performing the main baking process, the front surface is small in unevenness in comparison to a main baking unit PZT layer formed by performing the gelled film forming process, constituted of the coating process, the drying process, and the prebaking process, a plurality of times and thereafter performing the main baking process. Therefore with the present arrangement, the unevenness of the front surface of the uppermost main baking unit PZT layer is small. The piezoelectric film with a smooth uppermost surface is thereby obtained.

B4. The piezoelectric film according to "B3.," where the main baking unit PZT layer that is second from the top is formed by performing the gelled film forming process, constituted of the coating process, the drying process, and the prebaking process, a plurality of times and thereafter performing the main baking process.

B5. The piezoelectric film according to "B3.," where each main baking unit PZT layer other than the uppermost main baking unit PZT layer is formed by performing the gelled film forming process, constituted of the coating process, the drying process, and the prebaking process, a plurality of times and thereafter performing the main baking process.

B6. The piezoelectric film according to any one of "B1." to "B5.," including a first seed layer present at a lower surface side of a lowermost main baking unit PZT layer. With this arrangement, directions of crystals of the respective main baking unit PZT layers are aligned readily. The piezoelectric film having stable piezoelectric characteristics is thereby obtained.

B7. The piezoelectric film according to "B6.," including a second seed layer interposed between two adjacent main baking unit PZT layers at an intermediate position between the lowermost main baking unit PZT layer and the uppermost main baking unit PZT layer. With this arrangement, the directions of the crystals of the respective main baking unit PZT layers are aligned more readily. The piezoelectric film having more stable piezoelectric characteristics is thereby obtained.

B8. The piezoelectric film according to "B7.," where the first seed layer and the second seed layer are arranged from the same material. With this arrangement, the manufacturing efficiency of the piezoelectric film can be improved.

B9. The piezoelectric film according to "B8.," where the first seed layer and the second seed layer are arranged from PZT seed layers constituted of PZT.

B10. The piezoelectric film according to "B8.," where the first seed layer and the second seed layer are arranged from TiO seed layers constituted of titanium oxide.

B11. The piezoelectric film according to "B7.," where the first seed layer and the second seed layer are arranged from different materials.

B12. The piezoelectric film according to "B11.," where the first seed layer is arranged from a TiO seed layer constituted of titanium oxide and the second seed layer is arranged from a PZT seed layer constituted of PZT.

B13. The piezoelectric film according to "B11.," where the first seed layer is arranged from a PZT seed layer constituted of PZT and the second seed layer is arranged from a TiO seed layer constituted of titanium oxide.

B14. The piezoelectric film according to any one of "B9.," "B12.," or "B13.," where the PZT seed layer is formed by performing a gelled film forming process, constituted of a coating process of coating on a precursor solution, containing PZT, a drying process of drying the coating film, and a prebaking process of heating the coating film after the drying process to make the coating film undergo gelling, once and thereafter performing a main baking process of heat-treating and thereby sintering the gelled coating film.

B15. A piezoelectric element including a lower electrode, the piezoelectric film according to any one of "B1." to "B14." that is formed on the lower electrode, and an upper electrode formed on the piezoelectric film. With this arrangement, adhesion between the piezoelectric film and the upper electrode can be improved because the uppermost surface of the piezoelectric element is smooth. Also, parallelism between the lower electrode and the upper electrode can be improved and therefore the piezoelectric film can be improved in piezoelectric performance. The piezoelectric element having excellent piezoelectric characteristics can thereby be provided.

B16. An inkjet printing head including a cavity, a vibrating film disposed on the cavity and defining a top surface portion of the cavity, and the piezoelectric element according to "B15." that is formed on the vibrating film. With this arrangement, the inkjet printing head that can realize stable discharge can be provided by the use of the piezoelectric element having stable piezoelectric characteristics.

While preferred embodiments of the present invention have been described above, it is to be understood that variations and modifications will be apparent to those skilled in the art without departing the scope and sprit of the present invention. The scope of the present invention, therefore, is to be determined solely by the following claims.

What is claimed is:

1. A piezoelectric film, comprising:
   a plurality of laminated main baking unit PZT layers;
   a first seed layer present at a lower surface side of a lowermost main baking unit PZT layer; and
   a second seed layer interposed between two adjacent main baking unit PZT layers at an intermediate position between the lowermost main baking unit PZT layer and an uppermost main baking unit PZT layer,
   wherein the first seed layer and the second seed layer are formed from a same material, and
   the first seed layer and the second seed layer are formed from TiO seed layers constituted of titanium oxide.

2. A piezoelectric element, comprising:
   a lower electrode;
   the piezoelectric film according to claim 1, formed on the lower electrode; and
   an upper electrode formed on the piezoelectric film.

3. An inkjet printing head, comprising:
   a cavity;
   a vibrating film disposed on the cavity and defining a top surface portion of the cavity; and
   the piezoelectric element according to claim 2, formed on the vibrating film.

4. A piezoelectric film, comprising:
   a plurality of laminated main baking unit PZT layers;
   a first seed layer present at a lower surface side of a lowermost main baking unit PZT layer; and
   a second seed layer interposed between two adjacent main baking unit PZT layers at an intermediate position between the lowermost main baking unit PZT layer and an uppermost main baking unit PZT layer,
   wherein the first seed layer and the second seed layer are formed from different materials, and
   the first seed layer is formed from a TiO seed layer constituted of titanium oxide and the second seed layer is formed from a PZT seed layer constituted of PZT.

5. The piezoelectric film according to claim 4, wherein the PZT seed layer is formed by performing a gelled film forming process, constituted of a coating process of coating on a precursor solution, containing PZT, a drying process of drying the coating film, and a prebaking process of heating the coating film after the drying process to make the coating film undergo gelling, once and thereafter performing a main baking process of heat-treating and thereby sintering the gelled coating film.

6. A piezoelectric element, comprising:
   a lower electrode;
   the piezoelectric film according to claim 4, formed on the lower electrode; and
   an upper electrode formed on the piezoelectric film.

7. An inkjet printing head, comprising:
   a cavity;
   a vibrating film disposed on the cavity and defining a top surface portion of the cavity; and
   the piezoelectric element according to claim 6, formed on the vibrating film.

8. A piezoelectric film, comprising:
   a plurality of laminated main baking unit PZT layers;
   a first seed layer present at a lower surface side of a lowermost main baking unit PZT layer; and
   a second seed layer interposed between two adjacent main baking unit PZT layers at an intermediate position between the lowermost main baking unit PZT layer and an uppermost main baking unit PZT layer,
   wherein the first seed layer and the second seed layer are formed from different materials, and
   the first seed layer is formed from a PZT seed layer constituted of PZT and the second seed layer is formed from a TiO seed layer constituted of titanium oxide.

9. The piezoelectric film according to claim 8, wherein the PZT seed layer is formed by performing a gelled film forming process, constituted of a coating process of coating on a precursor solution, containing PZT, a drying process of drying the coating film, and a prebaking process of heating the coating film after the drying process to make the coating film undergo gelling, once and thereafter performing a main baking process of heat-treating and thereby sintering the gelled coating film.

10. A piezoelectric element, comprising:
    a lower electrode;
    the piezoelectric film according to claim 8, formed on the lower electrode; and
    an upper electrode formed on the piezoelectric film.

11. An inkjet printing head, comprising:
    a cavity;
    a vibrating film disposed on the cavity and defining a top surface portion of the cavity; and
    the piezoelectric element according to claim 10, formed on the vibrating film.

* * * * *